United States Patent
Liao et al.

(10) Patent No.: US 11,116,072 B2
(45) Date of Patent: Sep. 7, 2021

(54) DISCRETE CIRCUIT HAVING CROSS-TALK NOISE CANCELLATION CIRCUITRY AND METHOD THEREOF

(71) Applicant: Intel Corporation, Santa Clara, CA (US)

(72) Inventors: Jun Liao, Hillsboro, OR (US); Zhen Zhou, Chandler, AZ (US); James A. McCall, Portland, OR (US); Jong-Ru Guo, Portland, OR (US); Xiang Li, Portland, OR (US); Yunhui Chu, Hillsboro, OR (US); Zuoguo Wu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/817,098

(22) Filed: Nov. 17, 2017

(65) Prior Publication Data

US 2019/0045622 A1 Feb. 7, 2019

Related U.S. Application Data

(60) Provisional application No. 62/528,746, filed on Jul. 5, 2017.

(51) Int. Cl.
*H05K 1/02* (2006.01)
*H05K 1/14* (2006.01)
*H04B 3/32* (2006.01)
*H01L 23/66* (2006.01)

(52) U.S. Cl.
CPC ............ *H05K 1/0228* (2013.01); *H04B 3/32* (2013.01); *H05K 1/145* (2013.01); *H01L 23/66* (2013.01); *H01L 2224/16227* (2013.01); *H01L 2924/1434* (2013.01); *H01L 2924/15153* (2013.01); *H01L 2924/15311* (2013.01); *H01L 2924/15312* (2013.01); *H01L 2924/15313* (2013.01); *H05K 2201/09227* (2013.01)

(58) Field of Classification Search
CPC .......... H05K 1/00; H05K 1/02; H05K 1/0228; H04L 9/00; H04L 9/06; H04L 9/066; G06F 13/12; G06F 13/14; G06F 13/16; G06F 13/20
USPC .......................... 361/760, 764, 784, 795, 803
See application file for complete search history.

(56) References Cited

U.S. PATENT DOCUMENTS

| | | | | |
|---|---|---|---|---|
| 5,557,672 A * | 9/1996 | Perry | ................... | H04M 3/005 379/344 |
| 6,965,262 B2 * | 11/2005 | Zerbe | ..................... | G11C 7/02 327/336 |
| 7,197,676 B2 * | 3/2007 | Co | ......................... | G11C 29/56 714/42 |
| 7,570,685 B2 * | 8/2009 | Takatori | .................. | H04B 1/58 370/201 |
| 7,742,387 B2 * | 6/2010 | Hobbel | ................. | H04B 3/466 370/201 |
| 8,903,010 B2 * | 12/2014 | Won | .................... | H04L 25/0292 375/286 |

(Continued)

*Primary Examiner* — Tuan T Dinh
(74) *Attorney, Agent, or Firm* — Compass IP Law PC

(57) ABSTRACT

An apparatus is described. The apparatus includes a semiconductor chip having cross-talk noise cancellation circuitry disposed between a disturber trace and a trace to be protected from cross-talk noise emanating from the disturber trace. The trace is to be coupled to a receiver disposed on a different semiconductor chip.

19 Claims, 8 Drawing Sheets

(56) References Cited

U.S. PATENT DOCUMENTS

| | | | |
|---|---|---|---|
| 2004/0090927 A1* | 5/2004 | Zimmerman | H04B 3/32 370/268 |
| 2008/0144243 A1* | 6/2008 | Mariani | G01R 31/048 361/56 |
| 2009/0019204 A1* | 1/2009 | Cases | G06F 13/4086 710/301 |
| 2009/0290622 A1* | 11/2009 | Takatori | H04B 1/58 375/219 |
| 2010/0172060 A1* | 7/2010 | Woo | H01F 17/0006 361/56 |
| 2011/0293024 A1* | 12/2011 | Torres Canton | H04B 3/32 375/260 |
| 2014/0131843 A1* | 5/2014 | Balakrishnan | H02M 3/33507 257/666 |
| 2014/0134966 A1* | 5/2014 | Kung | H01L 23/5227 455/128 |
| 2014/0292399 A1* | 10/2014 | Kashiwakura | H01L 27/0629 327/552 |
| 2016/0094272 A1* | 3/2016 | Ye | H05K 1/0216 375/257 |
| 2016/0191058 A1* | 6/2016 | Bisht | G06F 30/392 326/63 |
| 2016/0285624 A1* | 9/2016 | Wagh | H04B 3/46 |

* cited by examiner

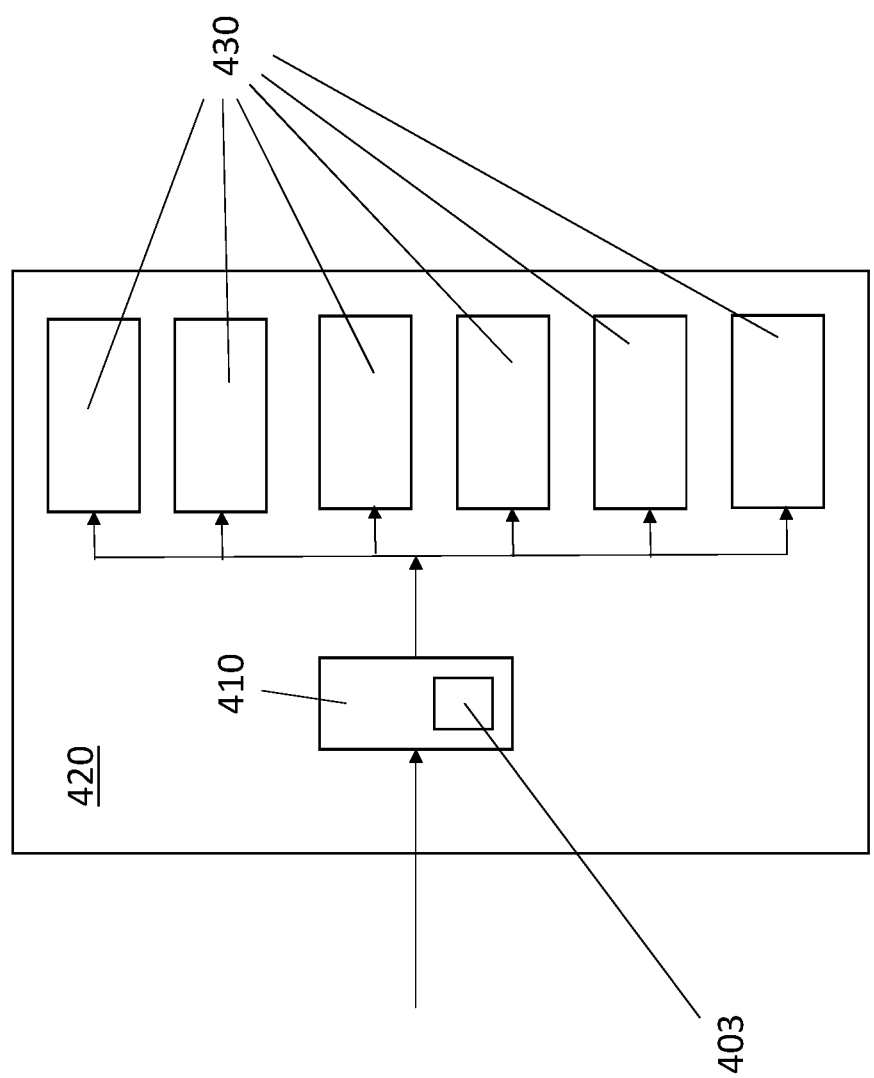

DISCRETE CIRCUIT HAVING CROSS-TALK NOISE CANCELLATION CIRCUITRY AND METHOD THEREOF

RELATED CASES

This application claims the benefit of U.S. Provisional Application No. 62/528,746, titled "DISCRETE CIRCUIT HAVING CROSS-TALK NOISE CANCELLATION CIRCUITRY", filed Jul. 5, 2017, which is incorporated by reference in its entirety.

FIELD OF INVENTION

The field of invention pertains generally to the electronic arts, and, more specifically, to a discrete circuit having cross-talk noise cancellation circuitry.

BACKGROUND

With the continual increase in signal frequency, cross-talk noise is becoming a more prevalent form of noise between proximate traces in an electronic system. As such, designers are faced with the challenge of how best to integrate cross-talk noise cancellation circuitry into the systems they design.

FIGURES

A better understanding of the present invention can be obtained from the following detailed description in conjunction with the following drawings, in which:

FIG. 4 shows a discrete semiconductor chip having cross talk noise cancellation circuitry disposed on a DIMM card;

DETAILED DESCRIPTION

Cross-talk is interference or noise added to a signal on a first wire or trace (hereinafter "signal trace" or just "trace") from a disturbing signal that is present on a second trace. Here, generally, proximately located traces have a channel between them even though they are separated by electrically insulating material. For instance, an insulating dielectric between two traces may form a capacitance that behaves akin to a short circuit between the two traces with increasing signal frequency on either of the traces.

As high frequency digital signals are generally composed of very high frequency components (beyond the fundamental (e.g., clock) frequency of the signal), these very high signal frequency components often propagate from the trace they are launched on to a nearby proximate trace. Upon being propagated to the proximate trace, the high frequency energy acts as noise on the second trace which can corrupt or otherwise interfere with proper reception of the second trace's signal. As such, it behooves designers to incorporate some form of cross-talk cancellation into the circuits they design if possible.

Figure 1A:
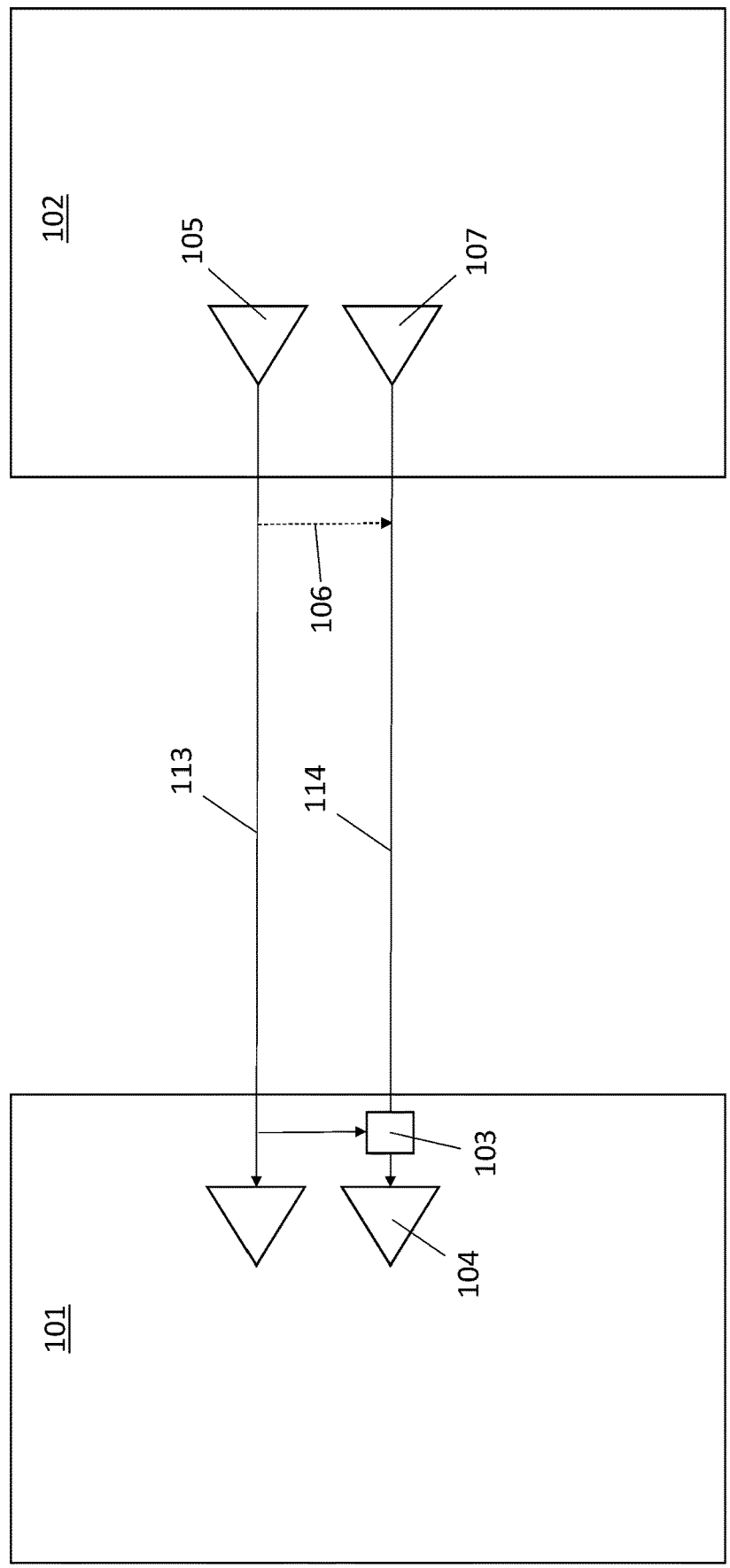
FIG. 1a depicts a prior art cross talk noise cancellation circuit arranged to protect a receiver.

FIG. 1a shows a cross-talk cancellation circuit 103 that is designed to cancel out cross-talk noise 106 from transmitter 105 that would otherwise be received by receiver 104 if the cancellation circuit 103 were not present. That is, ideally, receiver 104 only receives the signal transmitted by transmitter 107 on trace 114 and does not receive any signal energy from transmitter 105 on trace 113. Ideally, cross-talk cancellation circuit 103 is able to cancel out the cross-talk signal energy 106 so that receiver 104 only receives the signal from transmitter 107.

Figure 1B:
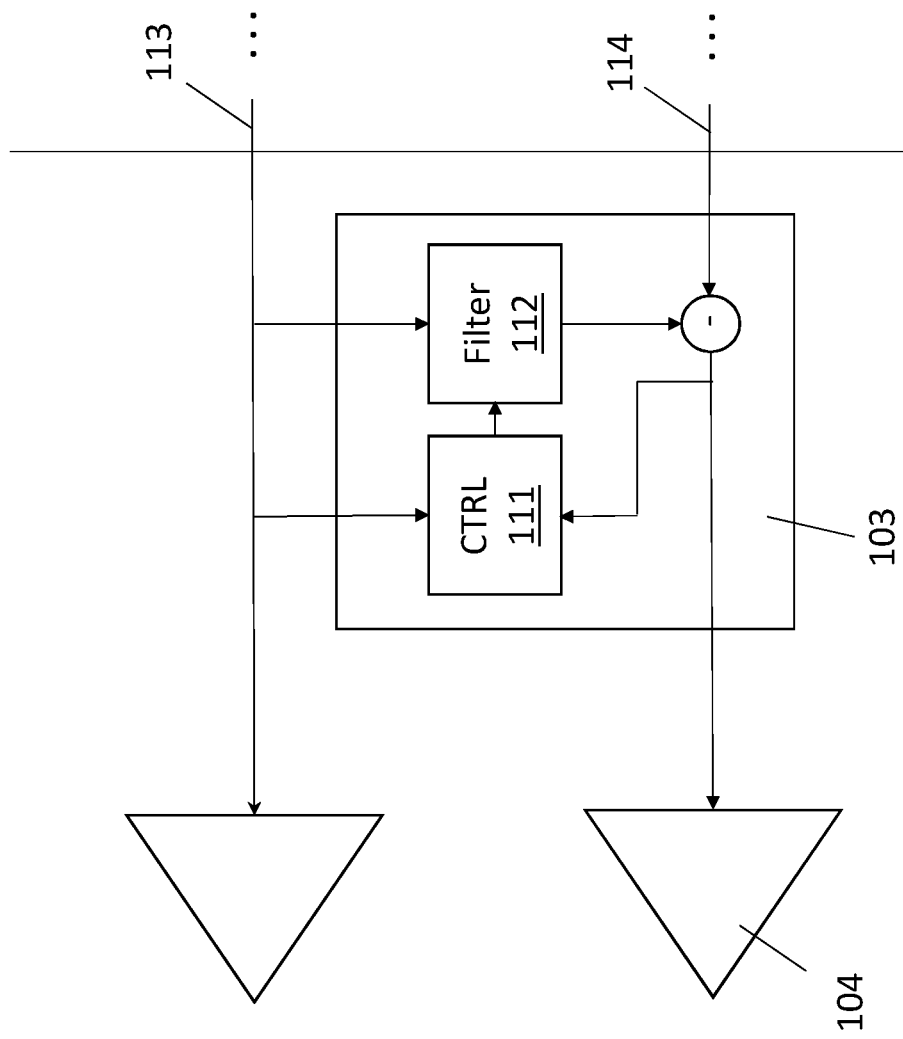
FIG. 1b depicts an embodiment of a cross talk noise cancellation circuit.

FIG. 1b shows a more detailed depiction of the cross-talk cancellation circuit 103 of FIG. 1a. As observed in FIG. 1b, the cross-talk cancellation circuit 103 includes a controller 111 and a filter 112. With knowledge that trace 113 can act as a cross-talk disturber to trace 114, the cross-talk cancellation circuit 103 is coupled to both the disturber trace 113 and the trace 114 being protected. During a training process, data on trace 114 and all other traces that are proximate to trace 114 are kept quiet other than trace 113 which is stimulated. In this environment, only the cross-talk noise 106 will be received by the cross-talk cancellation circuit 103.

Here, a controller 111 samples the received cross-talk noise 106 on trace 114 and the signal transmitted by transmitter 105 on trace 113 and performs an analysis on the two signals to develop a model of the channel that the cross-talk noise 106 passes through in order to propagate from trace 113 to trace 114. The controller then programs a filter 112 to mimic the channel. In operation, when transmitter 105 transmits a signal, the signal is received from trace 113 at the input to the filter 112. As the signal propagates through the filter 112, because the filter 112 mimics the cross-talk channel, a signal that is (ideally) identical to the cross-talk noise is generated at the output of the filter 112. The signal that is generated at the output of the filter 112 is then subtracted from the signal on trace 114 which should cancel out the cross-talk noise that exists on trace 114.

To the extent the designers are aware or suspect the existence of other traces that are sufficiently proximate to trace 114 so as to also disturb trace 114 via cross-talk, additional instances of cross-talk cancellation circuit 103 can be coupled between such other traces and trace 114. By so-doing, all cross-talk signal energy can be theoretically eliminated from trace 114.

Unfortunately, cross-talk cancellation circuitry 103 can consume large amounts of semiconductor chip space and power. As such, the integration of cross-talk cancellation circuitry 103 on a semiconductor chip, such as semiconductor chip 101, can increase both the cost, size and power budget of the semiconductor chip 101. The issue may be particularly unfortunate in the case where the semiconductor chip 101 is a large system-on-chip (SoC), such as a multi-core processor having an integrated main memory control hub and a peripheral control hub. Here, for instance, traces 113, 114 may correspond to data bus wires of a main memory channel and semiconductor chip 102 may correspond to a memory chip that is coupled to the memory channel.

Another drawback of integrating cross talk cancellation circuitry on the same die as the receiver that is being protected is that the incoming signal to be cleaned of cross talk noise may be so corrupted when it reaches the receiver 104 (has very large noise power) that the cancellation offered by the cross-talk cancellation circuitry 103 does not sufficiently reduce the noise and the signal to noise ratio is not high enough to supper the desired data rate at the desired speed.

A solution is to remove the cross-talk cancellation circuitry 103 from the semiconductor chip 101 and instead integrate it, e.g., as a stand-alone-device, outside the semiconductor chip 101.

Figure 2:
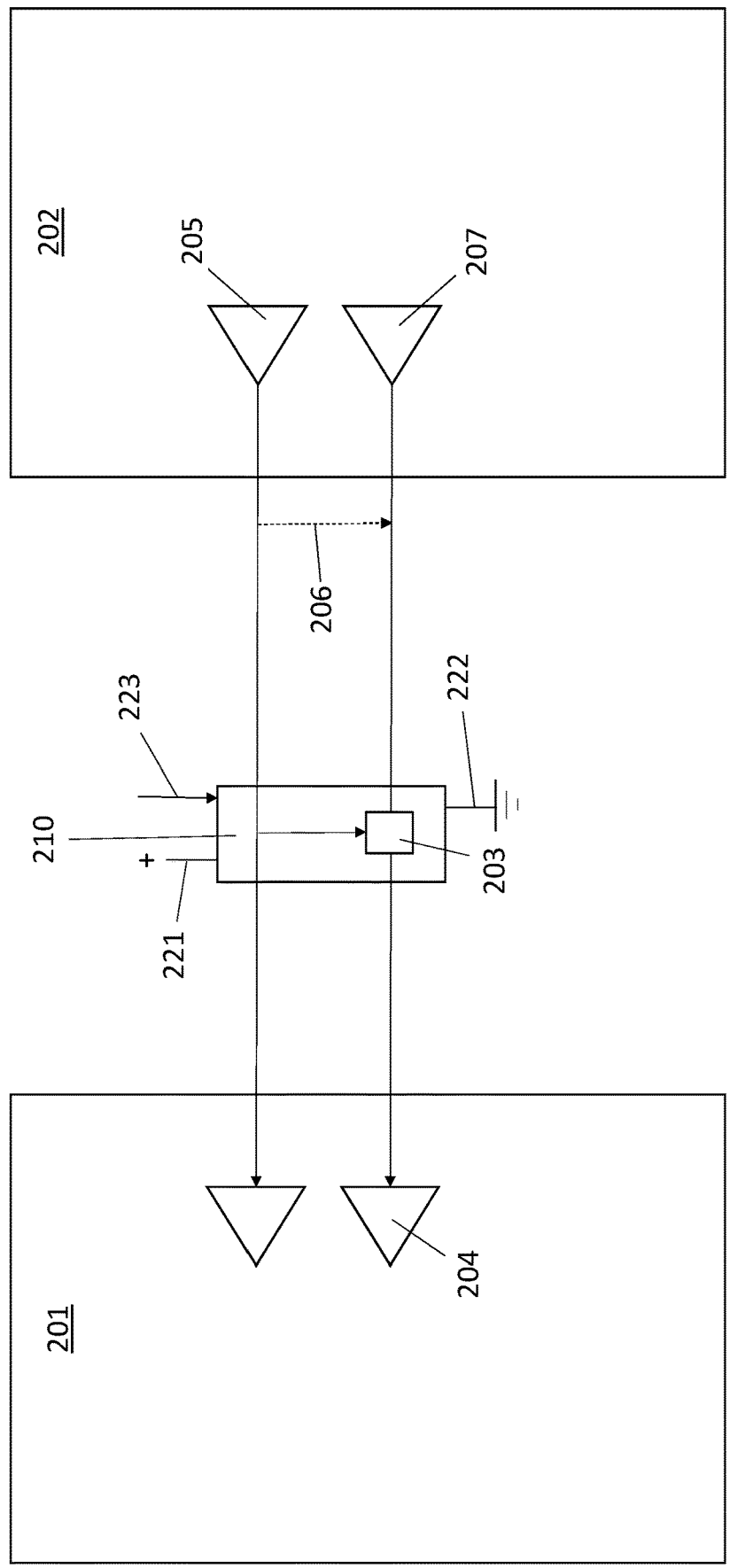
FIG. 2 depicts a discrete cross talk noise cancellation semiconductor chip that is separate from the semiconductor chip having the receiver being protected.

FIG. 2 shows an embodiment of such an approach where the cross-talk cancellation circuitry 203 has been integrated on separate discrete integrated circuit 210. Note that the operation of cross-talk cancellation circuit 203 may be the same as the cross-talk cancellation circuit 103 of FIGS. 1a and 1b. That is, in various embodiments, there is no substantial difference in the manner in which cross talk noise is cancelled even though the cancellation circuit 203 has been moved out of the semiconductor chip 101. It is pertinent to mention that noise-cancellation approaches that are different than the specific type of approach discussed above with respect to FIG. 1b can also be used (e.g., circuitry that creates the S-parameter matrix orthogonal to the S-parameter matrix of the victim plus the aggressors; circuitry that combines the aggressor's signal passing through a high pass filter with the signal input from the victim and then amplifies the combined signal; or, a summer integrator type of circuit that integrates the combination of the victim signal plus crosstalk and then combines with the aggressor's signal passing through a high pass filter).

In various embodiments, the discrete circuit 210 is placed close to troublesome interconnect (e.g., board connector, socket connector, backplane connector, etc.) that is believed to be a potential source of cross-talk noise so as to eliminate the noise created by the connector in the immediate proximity of the noise inducing connector. As observed in FIG. 2, the discrete circuit 210 is coupled to its own power 221, ground 222 and control input channel 223 to control settings, a controller or otherwise control the noise cancellation circuitry.

Note that in the case of a memory system, such as the system memory of a computing system (also referred to as the computing system's main memory), information flow is generally in only one direction so that any noise-cancellation disturbance is a far-end type of disturbance rather than a near-end type of disturbance. Here, near-end disturbance can be characterized as a disturbance from a transmitting source that is located proximate to the receiver that is being protected and/or is transmitting in a direction opposite than the direction that information is being received by the receiver that is being protected.

For example, if a transmitter existed next to receiver 204 and transmitted to chip 202 while transmitter 207 was transmitting, such a transmitter could be characterized as a near end disturber source. However, simultaneous bi-directional signal flows generally do not exist with respect to memory systems because data is either being written to memory or read from memory. In FIG. 2, if chip 201 is the host side processor with memory controller and chip 202 is a memory device, the discrete cross-talk cancellation circuit 203 as depicted is protecting the data read receiver 204 of the memory controller (it cancels cross-talk noise during a memory read). Another set of discrete cross-talk cancellation circuits (not shown in FIG. 2) may also exist that protect receivers on the memory chip 102 against cross talk during a memory write.

The memory channel may be an industry standard system memory channel such as a double data rate (DDR) memory channel published by an industry standards organization (such as the Joint Electron Device Engineering Council (JEDEC) such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.ord). Such standards (and similar standards) may be referred to as DDR-based standards and communication interfaces of the storage devices that implement such standards may be referred to as DDR-based interfaces. Memory channel embodiments may include a DDR5 memory channel or a low power DDR5 memory channel (LPDDR5).

Figure 3A:
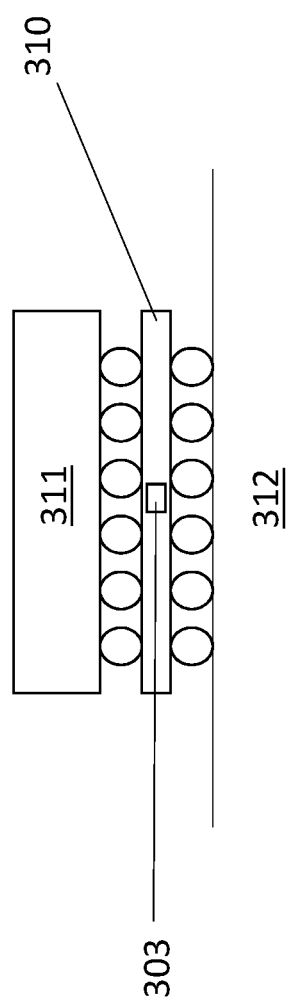
FIG. 3a shows cross talk noise cancellation circuitry within an interposer.

FIG. 3a shows one embodiment of a discrete interposer-like chip (or packaged chip) 310 having noise cancellation circuitry 303. Here, interposer-like chip/package 310 is disposed vertically between a top chip 311 and a lower substrate 312 (e.g., a personal computer board (PC board)). The interposer chip/package 310 may include top side pads that are to align with the I/O balls on the bottom of the upper chip 311. Likewise, I/O balls on the bottom of the interposer chip/package 310 align with pads on the top surface of the substrate 312.

Logically, in various embodiments, each signal input I/O ball on the bottom side of the upper chip 311 has a corresponding trace that runs through the interposer 310 from a corresponding pad on the top surface of the substrate 312 to its bottom I/O ball on the upper chip 311. Each of these traces may run through its own cross-talk cancellation circuit 303 within the discrete interposer chip 310. The specific disturber traces that are coupled to each cross-talk cancellation circuit may be customized, e.g., based on the layout of the traces on the substrate 312 (e.g., traces that are coupled most proximately to a particular trace on the substrate 312 are coupled to the particular trace's cross-talk cancellation circuit within the interposer chip 310).

Owing to its stacked nature, the discrete cross talk interposer 310 of FIG. 3a may be particularly useful in small form factor or tightly constrained surface area application (such as a smaller computing system such as a handheld device). In various embodiments, upper chip 311 corresponds to a multi-core processor having an integrated system memory controller where the cross talk noise cancellation circuitry 303 of the interposer chip 310 cancels out cross talk noise on the data bus during a data read of one or more system memory channels that are coupled to system memory devices (not shown in FIG. 3a).

In same or other embodiments, upper chip 311 corresponds to a memory device (such as a memory device that is coupled to the aforementioned memory channel) and the noise cancellation circuitry 303 of the interposer chip 310 cancels out cross talk noise on a memory channel data but during a data write into the memory device 311. Here, memory device 311 may be implemented as multiple stacked memory chips.

FIG. 4 pertains to another system memory implementation for noise cancellation circuitry 403 that is integrated in a discrete chip 410 that is separate from the chips(s) 430 having the receivers that are being protected by the noise cancellation circuitry 403. Here, feature 420 corresponds to a dual in line memory module (DIMM) having a plurality of memory chips 430. As is known in the art, the DIMM card 420 may plug into a system memory channel that is disposed, e.g., on the motherboard of a computing system. In principle, the noise cancellation circuitry 403 operates akin to noise cancellation circuitry 303 of FIG. 3 and cancels out cross talk noise during a data write into the memory chips 430.

Here, the presence of the noise cancellation circuitry 403 outside the memory chips 430 should make the memory chips any of cheaper, consume less surface area, and/or consume less power than memory chips having integrated cross talk cancellation circuitry. In various embodiments, discrete chip 410 also contains data buffering circuitry that buffers certain signals prior to their being delivered to the memory chips 430 (e.g., DQ and DQS signals). Additionally, the presence of the noise cancellation circuitry can reduce the pin count or I/O count of the DIMM card.

Presently, because DIMM cards to not generally have cross-talk cancellation circuitry, many of the I/O pins of the DIMM are power or ground pins to eliminate/shield/ground cross-talk noise between memory channel signal traces. Generally, there is currently a 1:1 ratio of power/ground traces to signal traces for this reason. It is believed that with integrated cross talk noise cancellation 403 integrated on the DIMM, this ratio can drop to approximately 1:2 (one power or ground for every two signal traces).

Although the above example of FIG. 4 pertained to DIMM cards for memory channels, the same comments generally apply to any card that plugs into a backplane or motherboard, etc. Examples include graphics cards, solid state drive cards, etc.).

In still yet other embodiments, referring back to FIG. 2, again where the overall depicted circuitry corresponds to a system memory implementation, the discrete circuit 210 may correspond to any of other discrete chips that intercept signal wires of a system memory data channel such as a re-driver chip and/or a re-timing chip. In the case of the former, discrete chip 210 contains re-driver circuits that re-drive (e.g., amplify and/or sharpen edges of) signals on the memory channel. In the case of the former, the discrete chip 210 contains re-timer circuits that re-time (e.g., sharpen the phase positioning of the edges and/or pulses of) the signals on the memory channel. As such, discrete chip 210 may correspond to an integrated re-driver and cross-talk noise cancellation chip and/or an integrated re-timing and cross-talk noise cancellation circuit.

In still yet other embodiments, referring back to FIG. 3a, the I/Os of the interposer chip 310 may be designed for socketed electrical connections rather than soldered balls (e.g., with Pogo pin sockets). Here, the use of socketed connections makes the interposer chip 310 useful for cancelling out cross-talk in, e.g., testing environments where upper chip 311 is a device under test on, e.g., a manufacturing floor. That is, upper chip 311 may be a device that has recently been manufactured and is being tested prior to shipment. Here, the lower I/Os of the interposer 310 may include pins that plug into a socket in the substrate 312. The upper I/Os may mate with the balls or pins or pads on the bottom side of the upper chip 311.

During testing, the upper chip 311 is mated to the interposer 310 which then plugs into the sockets of the substrate 312 for testing. Here, as pins/sockets are generally inferior I/Os from a cross-talk perspective (they tend to introduce noticeable cross-talk during testing), but superior from an ease-of-use perspective (they allow the device under test to be easily added/removed to/from a test jig), the presence of the cross-talk cancellation circuitry 303 permits the ease-of-use advantage with the pins/sockets while eliminating the cross-talk associated with them.

Similarly, integrating an interposer 310 with cross-talk cancellation circuitry 303 can be used to eliminate cross-talk associated with I/O connections generally. Here, the I/Os on the bottom side of the interposer 310 may also be any of pins, balls or pads. As is known in the art, I/Os tend to introduce cross-talk noise. The cross talk cancellation circuitry 303 in the interposer 310 may eliminate such cross-talk that originates from the connection to the substrate 312 which may be, e.g., an actual motherboard in a computing system. That is, the interposer 310 may be used to eliminate cross-talk induced from I/O connections to a motherboard or other PC board.

Figure 3B:
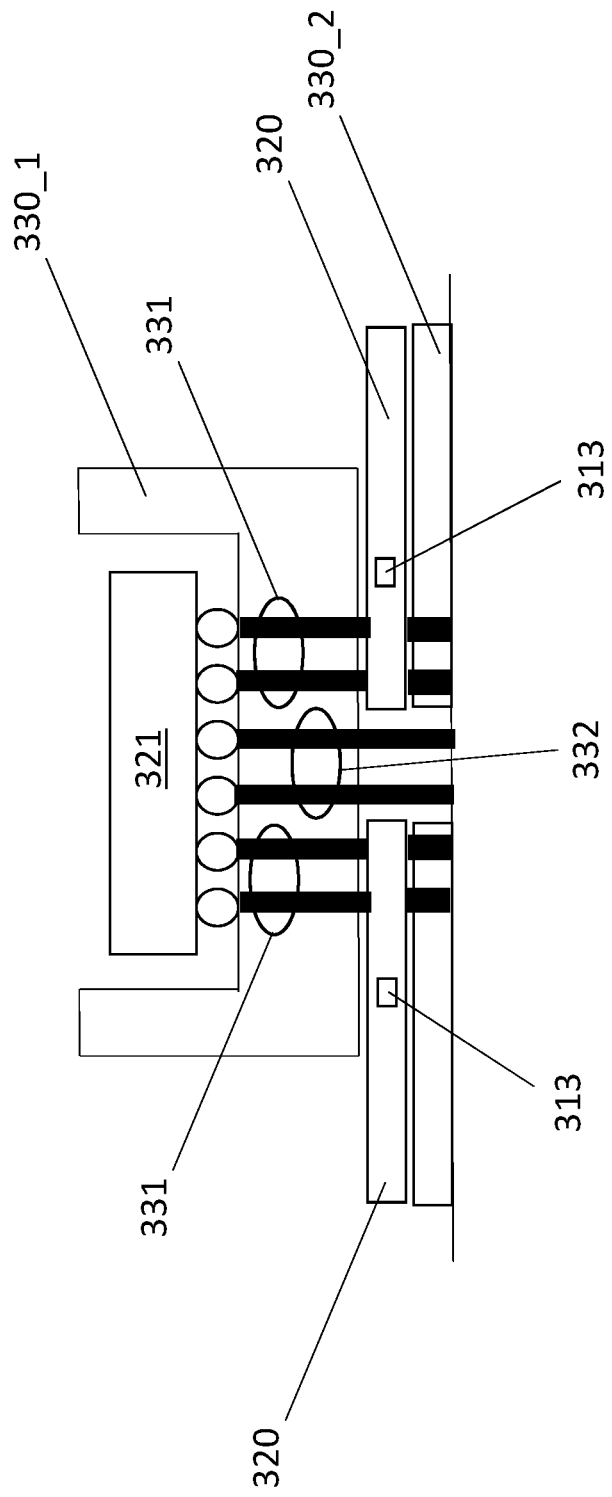
FIG. 3b shows another cross talk noise interposer in a test jig arrangement.

FIG. 3b depicts another alternative interposer embodiment for testing applications in which the interposer circuit 320 does not cover the entire underneath surface area of the upper chip 321. In the particular embodiment of FIG. 3b, a cavity is exposed beneath the middle underside of the upper chip 321. The interposer chip 320 with cross talk cancellation circuitry 313 extends around an outer periphery of the upper chip's underside. As such, noise protected traces 331 are located at the periphery of the structure whereas non noise protected traces 332 are located in the middle of the structure. This configuration can be applied to both testing and end user configurations. The socket 330 shown in FIG. 3b can be a spring loaded test socket or a stamped pin socket for finished product implementations. The chip package can be LGA (land grid array), BGA (ball grid array), and PGA (pin grid array).

As alluded to above, in any of the embodiments described above, referring back to FIG. 2, the discrete integrated circuit 210 with integrated cross talk elimination circuitry 202 may be customized in terms of which potentially disturbing traces are coupled to which specific noise cancellation circuit that eliminates noise from a particular signal trace. Here, with, e.g., some knowledge of the overall trace layout and/or associated signal energy, designers may pick and choose which traces are likely to act as disturbers to each signal in a channel or interconnect and only couple these specific traces to corresponding cross talk cancellation circuitry for each trace that the designers feel is at risk of being disturbed by cross-talk.

Figure 5:
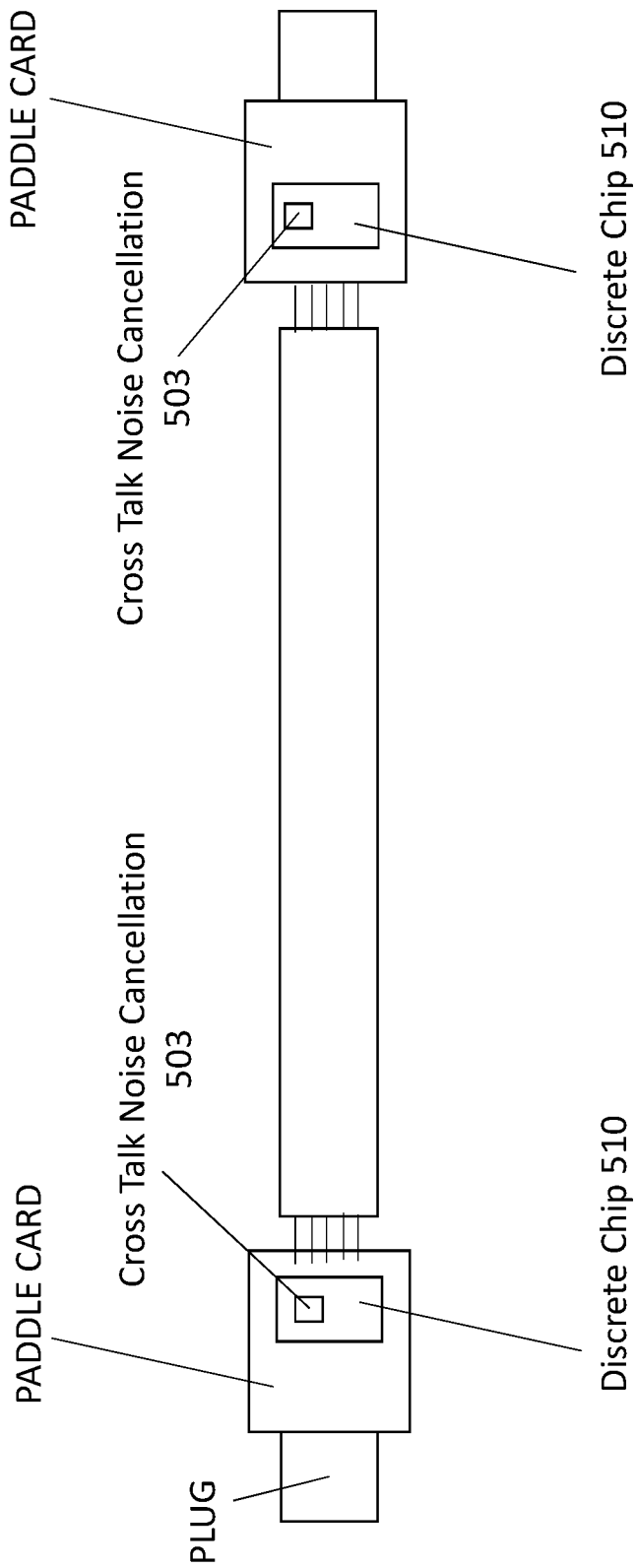
FIG. 5 shows a discrete semiconductor chip having cross talk noise cancellation circuitry coupled to a cable.

FIG. 5 shows another embodiment in which the cross-talk noise associated with cabled wires is substantially eliminated by way of a discrete cross-talk noise cancellation circuit being coupled closely to a connector of the cabled wire that is to couple to receivers that will be protected by the cross talk cancellation circuitry. Here, the cable may include a bundle of individual wires. The less such individual wires are shielded and/or are twisted the more cross-talk noise may be imparted amongst the wires. Here, discrete chips 510 may include respective cross-talk noise cancellation circuitry 503 to remove such cross-talk noise prior to the signals on the wires being received by a receiver that the cable plugs into.

Note that the left side cross talk noise cancellation circuit can cancel noise on left-wise propagating signals to protect receivers that couple to the left cable plug. By contrast, the right side cross talk noise cancellation circuit can cancel noise on right-wise propagating signals to protect receivers that couple to the right cable plug. Additionally, the leftmost noise cancellation circuit can provide far end protection for receivers coupled to the right plug by cancelling cross talk noise from transmitters that are transmitting into the left cable plug. Vice versa for the right hand side noise cancellation circuitry.

Figure 6:
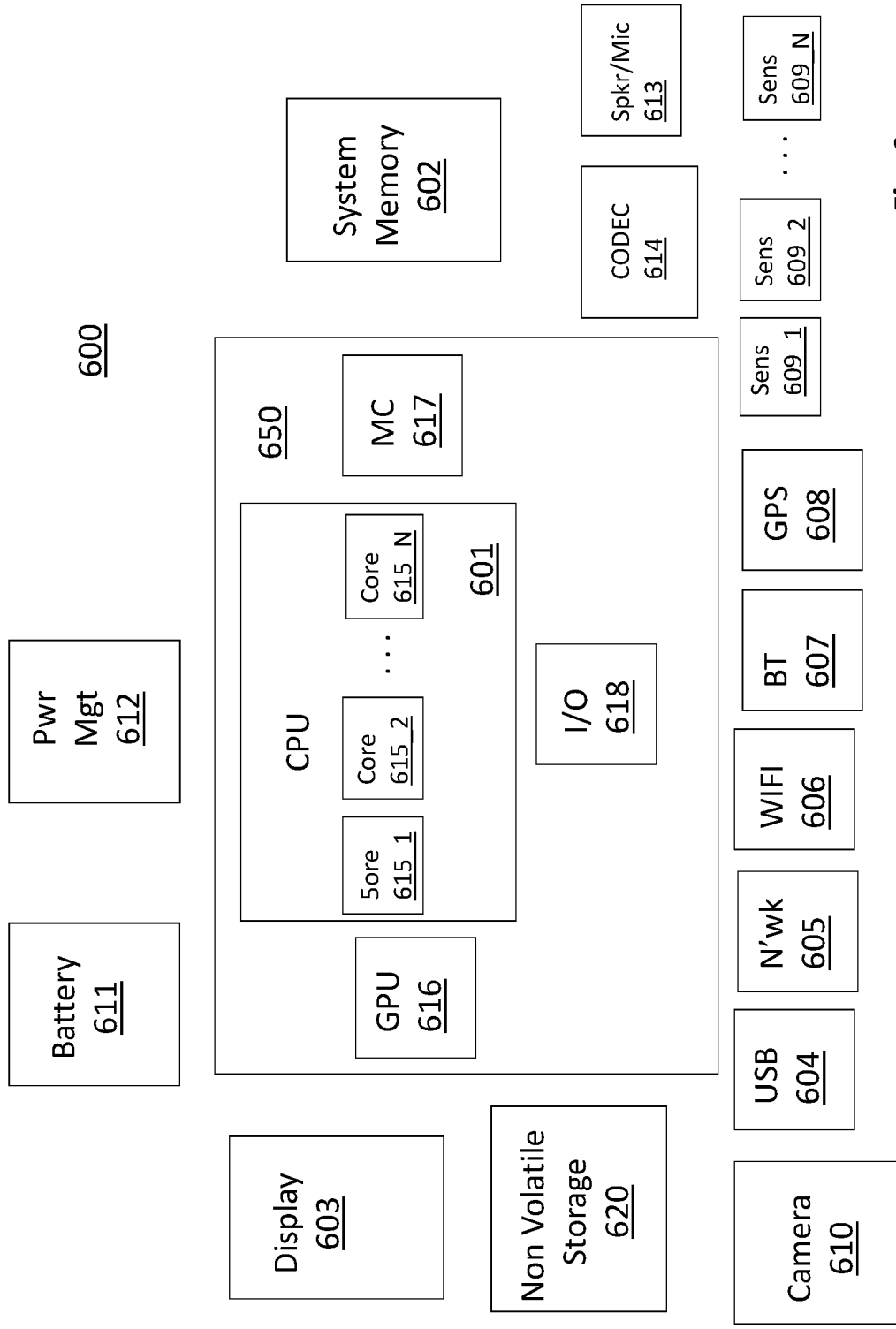
FIG. 6 shows a computing system.

FIG. 6 shows a depiction of an exemplary computing system 600 such as a personal computing system (e.g., desktop or laptop) or a mobile or handheld computing system such as a tablet device or smartphone, or, a larger computing system such as a server computing system.

As observed in FIG. 6, the basic computing system may include a central processing unit 601 (which may include, e.g., a plurality of general purpose processing cores and a main memory controller disposed on an applications processor or multi-core processor), system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_N (e.g., one or more of a gyroscope, an accelerometer, a magnetometer, a temperature sensor, a pressure sensor, a humidity sensor, etc.), a camera 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing units 616 typically execute graphics intensive functions to, e.g., generate graphics information that is presented on the display 603. The memory control function 617, which may be referred to as a main memory controller or system memory controller, interfaces with the system memory 602.

Each of the touchscreen display 603, the communication interfaces 604-607, the GPS interface 608, the sensors 609, the camera 610, and the speaker/microphone codec 613, 614 all can be viewed as various forms of I/O (input and/or output) relative to the overall computing system including, where appropriate, an integrated peripheral device as well (e.g., the camera 610). Depending on implementation, various ones of these I/O components may be integrated on the applications processor/multi-core processor 650 or may be located off the die or outside the package of the applications processor/multi-core processor 650. Non-volatile storage 620 may include non-volatile mass storage which may be implemented with a stacked memory device as described above. Non-volatile storage 620 may hold the BIOS and/or firmware of the computing system.

The computing system may include cross talk noise cancellation circuitry that is integrated on a discrete semiconductor chip other than the semiconductor chip upon which the receiver being protected by the cross-talk noise cancellation circuitry is integrated.

One or more various signal wires within the computing system, e.g., a data or address wire of a memory bus that couples the main memory controller to the system memory, may include a receiver that is implemented as decision feedback equalizer circuit that internally compensates for changes in electron mobility as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

The invention claimed is:

1. An apparatus, comprising:
a semiconductor chip to be disposed between a transmitting semiconductor chip and a receiving semiconductor chip, the semiconductor chip comprising cross-talk noise cancellation circuitry disposed between a disturber trace and a trace to be protected from cross-talk noise emanating from said disturber trace, said trace to be protected from cross-talk noise emanating from said disturber trace to be coupled to a receiver disposed on the receiving semiconductor chip, wherein, a first signal that is to propagate on said disturber trace is to be received by said semiconductor chip at a first input of said semiconductor chip, and wherein, a second signal that is to propagate on said trace to be protected from cross-talk noise emanating from said disturber trace is to be received by said semiconductor chip at a second input of said semiconductor chip, wherein, at least one of said first and second signals are driven by said transmitting semiconductor chip, wherein said disturber trace and said trace to be protected from cross-talk noise emanating from said disturber trace are components of a memory channel.

2. The apparatus of claim 1 wherein said semiconductor chip is disposed on a DIMM card and said receiving semiconductor chip is a memory semiconductor chip.

3. The apparatus of claim 1 wherein said semiconductor chip is a re-driver semiconductor chip.

4. The apparatus of claim 1 wherein said semiconductor chip is a re-timer semiconductor chip.

5. The apparatus of claim 1 wherein said semiconductor chip is an interposer that is to be located between a substrate and said receiving semiconductor chip in a stacked chip arrangement.

6. The apparatus of claim 1 wherein said disturber trace and said trace to be protected from cross-talk noise emanating from said disturber trace are to be coupled to wires in a cable.

7. The apparatus of claim 1 wherein said receiving semiconductor chip is a multi-core processor semiconductor chip.

8. The apparatus of claim 2 wherein said semiconductor chip comprises a buffer circuit.

9. The apparatus of claim 5 wherein said semiconductor chip is part of a test apparatus comprising I/O pins.

10. The apparatus of claim 8 wherein said buffer circuit is to buffer DQ and/or DQS signals.

11. A computing system, comprising:
a plurality of processing cores;
a system memory;
a memory controller coupled between said plurality of processing cores and said system memory;
a trace;

a disturber trace;
a semiconductor chip disposed between a transmitting semiconductor chip and a receiving semiconductor chip, the semiconductor chip comprising cross-talk noise cancellation circuitry disposed between said disturber trace and said trace, said trace to be protected from cross-talk noise emanating from said disturber trace by said cross-talk noise cancellation circuitry, said trace to be protected from cross-talk noise emanating from said disturber trace to be coupled to a receiver disposed on said receiving semiconductor chip, wherein, a first signal that is to propagate on said disturber trace is to be received by said semiconductor chip at a first input of said semiconductor chip, and wherein, a second signal that is to propagate on said trace to be protected from cross-talk noise emanating from said disturber trace is to be received by said semiconductor chip at a second input of said semiconductor chip, wherein, at least one of said first and second signals are driven by said transmitting semiconductor chip.

12. The computing system of claim 11 wherein said semiconductor chip is disposed on a DIMM card and said receiving semiconductor chip is a memory semiconductor chip.

13. The computing system of claim 11 wherein said disturber trace and said trace to be protected from cross-talk noise emanating from said disturber trace are components of a memory channel.

14. The computing system of claim 11 wherein said plurality of processing cores and said memory controller are disposed on a multi-core processor semiconductor chip.

15. The computing system of claim 12 wherein said semiconductor chip comprises a buffer circuit.

16. The computing system of claim 13 wherein said semiconductor chip is a re-driver semiconductor chip.

17. The computing system of claim 13 wherein said semiconductor chip is a re-timer semiconductor chip.

18. The computing system of claim 15 wherein said buffer circuit is to buffer DQ and/or DQS signals.

19. A method for transmitting and receiving memory signals, comprising:
    transmitting a first signal and a second signal from a transmitting semiconductor chip;
    receiving the first signal at another semiconductor chip;
    receiving the second signal at the another semiconductor chip;
    propagating the first signal on a first trace on the another semiconductor chip;
    propagating the second signal on a second trace on the another semiconductor chip, wherein said first trace and said second trace are components of a memory channel;
    cancelling out from the second signal, on the another semiconductor chip, cross-talk noise emanating from the first signal; and,
    sending the second signal after the cancelling out from the another semiconductor chip to a receiver on a receiving semiconductor chip.

* * * * *